United States Patent
Li

(10) Patent No.: US 11,137,811 B2
(45) Date of Patent: Oct. 5, 2021

(54) POWER SUPPLY SYSTEM FOR REDUCING VOLTAGE FLUCTUATION OF RACK GPU

(71) Applicant: ZHENGZHOU YUNHAI INFORMATION TECHNOLOGY CO., LTD., Henan (CN)

(72) Inventor: Deheng Li, Henan (CN)

(73) Assignee: ZHENGZHOU YUNHAI INFORMATION TECHNOLOGY CO., LTD., Henan (CN)

(*) Notice: Subject to any disclaimer, the term of this patent is extended or adjusted under 35 U.S.C. 154(b) by 540 days.

(21) Appl. No.: 16/097,230

(22) PCT Filed: Dec. 28, 2017

(86) PCT No.: PCT/CN2017/119203
§ 371 (c)(1),
(2) Date: Oct. 26, 2018

(87) PCT Pub. No.: WO2019/000883
PCT Pub. Date: Jan. 3, 2019

(65) Prior Publication Data
US 2021/0223845 A1  Jul. 22, 2021

(30) Foreign Application Priority Data
Jun. 29, 2017  (CN) .......................... 201710517434.2

(51) Int. Cl.
*H05K 7/14* (2006.01)
*G06F 1/30* (2006.01)

(52) U.S. Cl.
CPC ........... *G06F 1/305* (2013.01); *H05K 7/1492* (2013.01); *H05K 7/1487* (2013.01); *H05K 7/1489* (2013.01)

(58) Field of Classification Search
CPC .............................. G06F 1/305; H05K 7/1492
See application file for complete search history.

(56) References Cited

U.S. PATENT DOCUMENTS 9,474,181 B2 * 10/2016 Bailey ....................... G06F 1/18
10,306,797 B2 * 5/2019 Sakalkar ................... G06F 1/26
(Continued)

FOREIGN PATENT DOCUMENTS

CN    104866057 A    8/2015
CN    106292981 A    1/2017
(Continued)

OTHER PUBLICATIONS

International Search Report for PCT/CN2017/119203 dated Mar. 29, 2018, ISA/CN.

*Primary Examiner* — Adrian S Wilson
(74) *Attorney, Agent, or Firm* — Yue (Robert) Xu; Apex Attorneys at Law, LLP

(57) ABSTRACT

A power supply system for reducing voltage fluctuation of a rack GPU, which includes: a PSU power supply module, two power supply copper plates including a first power supply copper plate and a second power supply copper plate, two transfer copper plates including a first transfer copper plate and a second transfer copper plate, and two crown clips including a first crown clip and a second crown clip. The PSU power supply module is connected to the first power supply copper plate, the first power supply copper plate is connected to a BUS BAR through the first transfer copper plate and the first crown clip sequentially, the BUS BAR is connected to the second power supply copper plate through the second crown clip and the second transfer copper plate sequentially, and the second power supply copper plate is connected to a GPU module mainboard.

10 Claims, 4 Drawing Sheets

(56) References Cited

U.S. PATENT DOCUMENTS

| | | | | |
|---|---|---|---|---|
| 10,404,322 B2* | 9/2019 | Sakalkar | .................... | G06F 1/18 |
| 2006/0098383 A1* | 5/2006 | Goesmann | ............. | H01G 11/10 |
| | | | | 361/272 |
| 2013/0249286 A1* | 9/2013 | Hou | .......................... | H02J 3/14 |
| | | | | 307/18 |
| 2013/0308265 A1* | 11/2013 | Arnouse | ............ | H05K 7/20709 |
| | | | | 361/679.41 |
| 2014/0115353 A1* | 4/2014 | Hutten | .................... | G06F 1/266 |
| | | | | 713/310 |
| 2015/0109132 A1* | 4/2015 | Wu | ...................... | G08B 21/182 |
| | | | | 340/657 |
| 2018/0027682 A1* | 1/2018 | Adiletta | ................ | H04L 41/145 |
| | | | | 361/679.31 |
| 2018/0068609 A1* | 3/2018 | Yamazaki | .............. | G06F 1/1649 |
| 2019/0141845 A1* | 5/2019 | Prakash | ............... | H05K 7/1492 |

FOREIGN PATENT DOCUMENTS

| | | |
|---|---|---|
| CN | 106325460 A | 1/2017 |
| CN | 107450702 A | 12/2017 |

* cited by examiner

POWER SUPPLY SYSTEM FOR REDUCING VOLTAGE FLUCTUATION OF RACK GPU

This application is a national phase application of PCT international patent application PCT/CN2017/119203, filed on Dec. 28, 2017 which claims the priority to Chinese Patent Application No. 201710517434.2, titled "POWER SUPPLY SYSTEM FOR REDUCING VOLTAGE FLUCTUATION OF RACK GPU", filed on Jun. 29, 2017 with the Chinese Patent Office, both of which are incorporated herein by reference in their entireties.

FIELD

The present disclosure relates to the technical field of power supply design for a server, and particularly to a power supply system for reducing voltage fluctuation of a rack GPU.

BACKGROUND

With rapid development of the internet and big data and with the advent of the cloud computing, a cloud server is required by more and more services, to realize graphics processing and data computing. With the gradual increase of service volume, conventional servers cannot meet the above requirement. Therefore, rack GPU servers are gradually developed and are widely applied to various industries.

The rack is powered in a centralized manner. A PSU power supply module, a GPU module and a server module are provided separately. An output of the PSU power supply module is connected to a crown clip (including a power crown clip connected to power supply, and a ground crown clip connected to ground) through a cable (including a power line and a ground line). The crown clip is connected to a BUS BAR (an electrically-conductive copper bar). The BUS BAR includes two copper bars arranged side by side, which includes a power supply copper bar and a ground copper bar. The BUS BAR is connected to each electricity consuming module through a crown clip and a cable, to power the electricity consuming module. The PSU power supply module is adjacent to the server module, and the server module is adjacent to the GPU module.

The GPU module consumes a large amount of power and is separated from the PSU power supply module by the server module, resulting in a too large distance between the power supply module and the GPU module which consumes a large amount of power, which does not facilitate power transmission. Further, each of the cable and the BUS BAR has a large length, resulting in a large parasitic inductance. Also, the crown clip is in contact with the BUS BAR with a small area, resulting in a large inductance of a contact resistance. The GPU module includes multiple GPUs. The GPU consumes a large amount of power in operation, and the GPU module consumes a large amount of power in operation. Large voltage fluctuation may be caused by a large parasitic effect in a power supply path. In a case that the voltage fluctuation of the GPU in operation exceeds an allowed range of voltage fluctuation, a malfunction may occur in the GPU, which affects system efficiency and may further result in a failure of an entire service.

SUMMARY

For the above disadvantages in the conventional technology, an objective of the present disclosure is to provide a power supply system for reducing voltage fluctuation of a rack GPU, so as to address the above technical problems.

To achieve the above objective, the present disclosure provides technical solutions as follows.

A power supply system for reducing voltage fluctuation of a rack GPU is provided, which includes a PSU power supply module, two power supply copper plates, two transfer copper plates, and two crown clips. The two power supply copper plates include a first power supply copper plate and a second power supply copper plate. The two transfer copper plates include a first transfer copper plate and a second transfer copper plate. The two crown clips include a first crown clip and a second crown clip. The PSU power supply module is connected to the first power supply copper plate. The first power supply copper plate is connected to the first crown clip through the first transfer copper plate. The first crown clip is connected to a BUS BAR. The BUS BAR is connected to the second power supply cooper plate through the second crown clip and the second transfer copper plate sequentially. The second power supply copper plate is connected to a GPU module mainboard.

Preferably, each of the two power supply copper plates includes a source power supply copper plate and a ground power supply copper plate. For each of the two power supply copper plates, the source power supply copper plate and the ground power supply copper plate are arranged to be parallel to each other, and the ground power supply copper plate is arranged above the source power supply copper plate. Each of the two transfer copper plates includes a ground transfer copper plate and a source transfer copper plate. For each of the two transfer copper plates, the ground transfer copper plate and the source transfer copper plate are arranged to be parallel to each other, and the ground transfer copper plate is arranged above the source transfer copper plate. Each of the two crown clips includes a ground crown clip and a source crown clip. For each of the two crown clips, the ground crown clip and the source crown clip are arranged to be parallel to each other. A width of the first crown clip is not greater than a width of the first transfer copper plate, and a width of the second crown clip is not greater than a width of the second transfer copper plate.

Preferably, the BUS BAR includes two parallel copper plates including a source copper plate and a ground copper plate.

Preferably, a Switch chip and multiple GPU connectors are arranged on the GPU module mainboard. Each of the multiple GPU connectors is connected to a GPU. GPU source screw holes, GPU ground screw holes, a GPU mainboard source screw hole, and a GPU mainboard ground screw hole are further arranged on the GPU module mainboard.

Preferably, GPU power supply screw holes are arranged on the source power supply copper plate of the second power supply copper plate, and ground screw holes are arranged on the ground power supply copper plate of the second power supply copper plate. A circular area filled with bare copper is arranged at the periphery of each of the power supply screw holes and the periphery of each of the ground screw holes.

Preferably, the second power supply copper plate is arranged right below the GPU module mainboard. The second power supply copper plate is connected to the GPU module mainboard with a screw, and supplies power to the GPU module mainboard. The second power supply copper plate is connected to each of the GPUs with a screw, and supplies power to the GPUs.

Preferably, a through hole through which a source screw passes is arranged on the ground power supply copper plate of the second power supply copper plate, and a diameter of the through hole is greater than a diameter of the source screw.

Preferably, an area of the source power supply copper plate of the second power supply copper plate is not less than an area of the GPU module mainboard.

Preferably, each of the first transfer copper plate and the second transfer copper plate is L-shaped.

Preferably, the first crown clip and the first transfer copper plate are secured with a screw, and the first transfer copper plate and the first power supply copper plate are secured with a screw. The second crown clip and the second transfer copper plate are secured with a screw, and the second transfer copper plate and the second power supply copper plate are secured with a screw.

In the architecture, positions of a server module and a GPU module are exchanged, so that the GPU module is adjacent to the PSU module. The PSU power supply module is connected to the first power supply copper plate, and the first power supply copper plate is connected to the first crown clip through the first transfer copper plate. The first crown clip is connected to a BUS BAR. The BUS BAR is connected to the second power supply copper plate through the second crown clip and the second transfer copper plate sequentially. The second power supply copper plate is connected to the GPU module mainboard with a screw, and supplies power to the GPU module mainboard.

The present disclosure has following beneficial effects. In the architecture, positions of the server module and the GPU module are exchanged, so that the GPU module is adjacent to the PSU module. The power source and the ground are designed to be a plane pair, to reduce a distance between the PSU power supply module and the GPU module which consumes a large amount of power. The ground power supply copper plate and the source power supply copper plate are sequentially arranged below the GPU module mainboard, to reduce parasitic inductance, contact resistance and contact inductance between the GPU module and the PSU power supply module, thereby reducing voltage fluctuation at the GPU, and improving design reliability.

In addition, the present disclosure has a reliable design principle, a simple structure, and a very wide application prospect.

It can be seen that as compared with the conventional technology, the present disclosure possesses prominent substantive features and notable progress, and has obvious beneficial effects of implementation.

REFERENCE NUMERALS IN FIG. 1 TO FIG. 4

1 PSU power supply module, 2 BUS BAR,
3 GPU module mainboard, 4 first crown clip,
5 second crown clip, 6 first transfer copper plate,
7 second transfer copper plate, 8 first power supply copper plate,
9 second power supply copper plate, 10 GPU mainboard source screw hole,
11 GPU source screw hole, 12 GPU ground screw hole,
13 GPU mainboard ground screw hole.

DETAILED DESCRIPTION

The present disclosure is described below in detail in conjunction with the drawings and the embodiments. The following embodiments are used to explain the present disclosure, and the present disclosure is not limited to the following embodiments.

Figure 1:
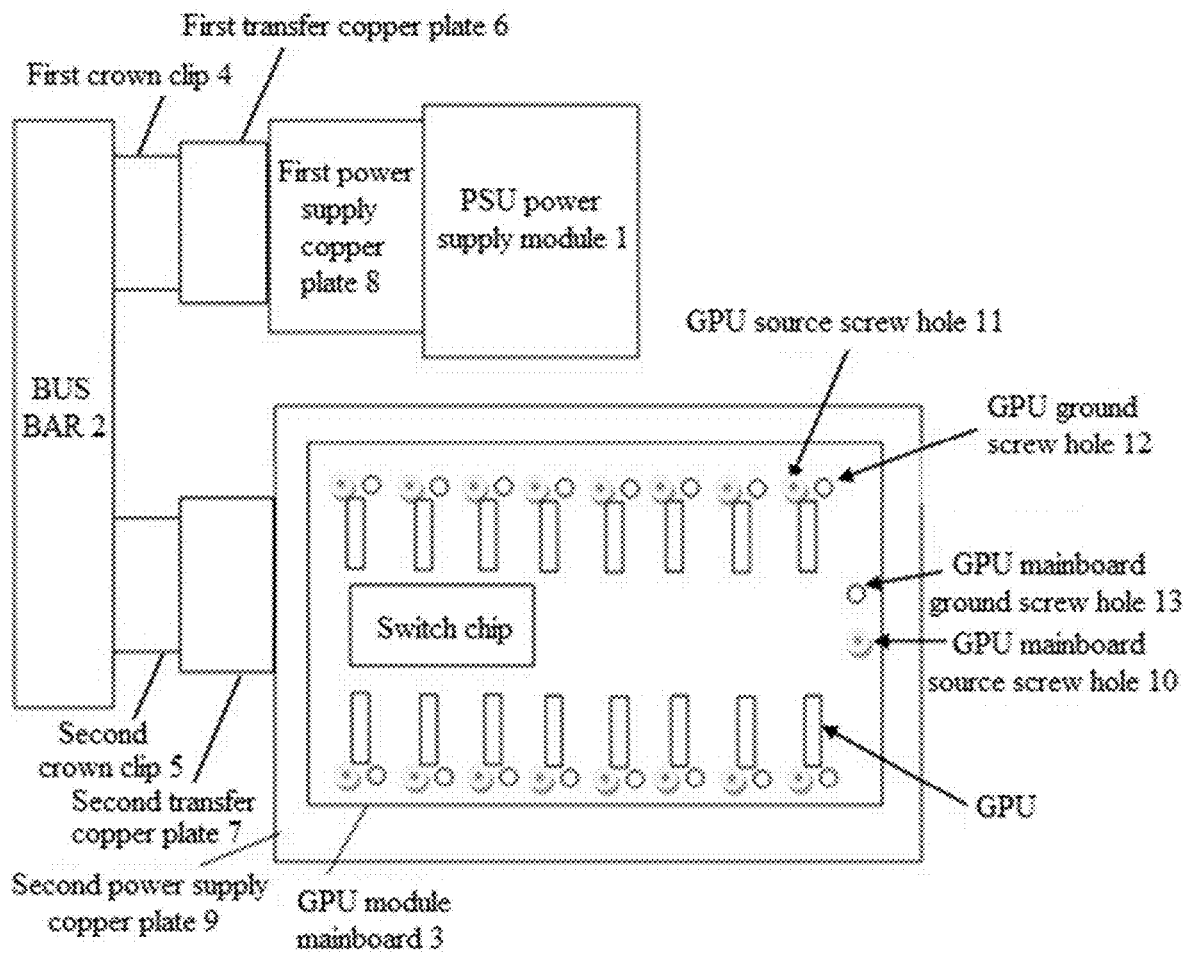
FIG. 1 is a schematic connection diagram of a power supply system for reducing voltage fluctuation of a rack GPU according to an embodiment of the present disclosure.

As shown in FIG. 1, a power supply system for reducing voltage fluctuation of a rack GPU is provided according to an embodiment, which includes a PSU power supply module 1. The PSU power supply module 1 is connected to a first power supply copper plate 8, and the first power supply copper plate 8 is connected to a first crown clip 4 through a first transfer copper plate 6. The first crown clip 4 is connected to a BUS BAR 2. The BUS BAR 2 is connected to a second power supply copper plate 9 through a second crown clip 5 and a second transfer copper plate 7 sequentially. The second power supply copper plate 9 is connected to a GPU module mainboard 3.

The first power supply copper plate 8 includes a source power supply copper plate and a ground power supply copper plate. The source power supply copper plate and the ground power supply copper plate of the first power supply copper plate 8 are arranged to be parallel to each other, and the ground power supply copper plate of the first power supply copper plate 8 is arranged above the source power supply copper plate of the first power supply copper plate 8.

The second power supply copper plate 9 includes a source power supply copper plate and a ground power supply copper plate. The source power supply copper plate and the ground power supply copper plate of the second power supply copper plate 9 are arranged to be parallel to each other, and the ground power supply copper plate of the second power supply copper plate 9 is arranged above the source power supply copper plate of the second power supply copper plate 9.

The first transfer copper plate 6 includes a ground transfer copper plate and a source transfer copper plate. The ground transfer copper plate and the source transfer copper plate of the first transfer copper plate 6 are arranged to be parallel to each other, and the ground transfer copper plate of the first transfer copper plate 6 is arranged above the source transfer copper plate of the first transfer copper plate 6.

The second transfer copper plate 7 includes a ground transfer copper plate and a source transfer copper plate. The ground transfer copper plate and the source transfer copper plate of the second transfer copper plate 7 are arranged to be parallel to each other, and the ground transfer copper plate of the second transfer copper plate 7 is arranged above the source transfer copper plate of the second transfer copper plate 7.

The first crown clip 4 includes a ground crown clip and a source crown clip. The ground crown clip and the source crown clip of the first crown clip 4 are arranged to be parallel to each other. A width of the first crown clip 4 is not greater than a width of the first transfer copper plate 6.

The second crown clip 5 includes a ground crown clip and a source crown clip. The ground crown clip and the source crown clip of the second crown clip 5 are arranged to be parallel to each other. A width of the second crown clip 5 is not greater than a width of the second transfer copper plate 7.

The BUS BAR 2 includes two parallel copper plates including a source copper plate and a ground copper plate.

A Switch chip and multiple GPU connectors are arranged on the GPU module mainboard 3. Each of the multiple GPU connectors is connected to a GPU. GPU source screw holes 11, GPU ground screw holes 12, a GPU mainboard source screw hole 10, and a GPU mainboard ground screw hole 13 are further arranged on the GPU module mainboard 3.

GPU power supply screw holes are arranged on the source power supply copper plate of the second power supply copper plate 9, and ground screw holes are arranged on the ground power supply copper plate of the second power supply copper plate 9. A circular area filled with bare copper is arranged at the peripheral of each of the power supply screw holes and the periphery of each of the ground screw holes. That is, a circular area filled with bare copper is arranged at the peripheral of the source screw hole, and a circular area filled with bare copper is arranged at the peripheral of the ground screw hole.

The second power supply copper plate 9 is arranged right below the GPU module mainboard 3. The second power supply copper plate 9 is connected to the GPU module mainboard 3 with a screw, and supplies power to the GPU module mainboard. The second power supply copper plate 9 is connected to each of the GPUs with a screw, and supplies power to the GPUs.

A through hole through which a source screw passes is arranged on the ground power supply copper plate of the second power supply copper plate 9, and a diameter of the through hole is greater than a diameter of the source screw. In this way, in a case that the screw hole of the source power supply copper plate of the second power supply copper plate 9 is connected to the GPU source screw hole 11 with the source screw, the source screw is isolated from the ground.

An area of the source power supply copper plate of the second power supply copper plate 9 is not less than an area of the GPU module mainboard 3.

Figure 2:
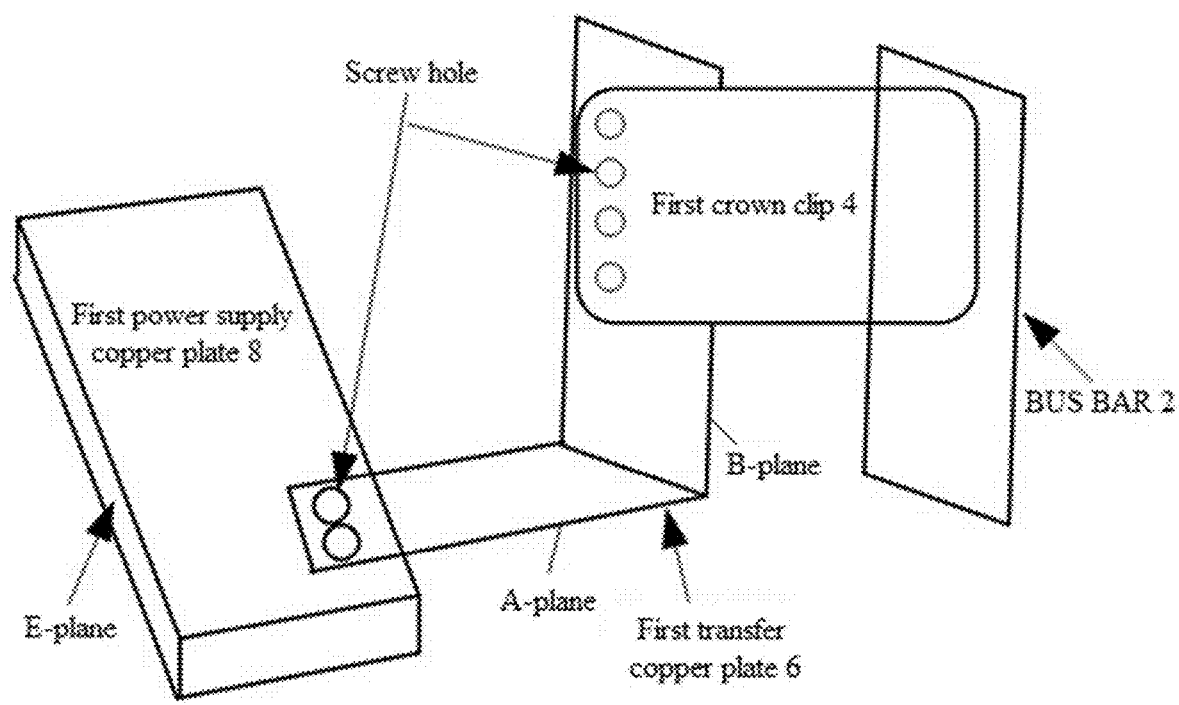
FIG. 2 is a schematic connection diagram of a part of the structure shown in FIG. 1.
Figure 3:
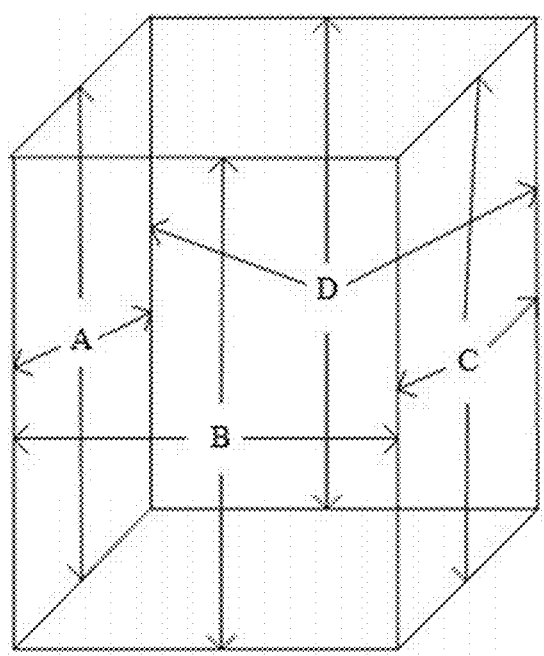
FIG. 3 is a schematic perspective diagram of a rack server.
Figure 4:
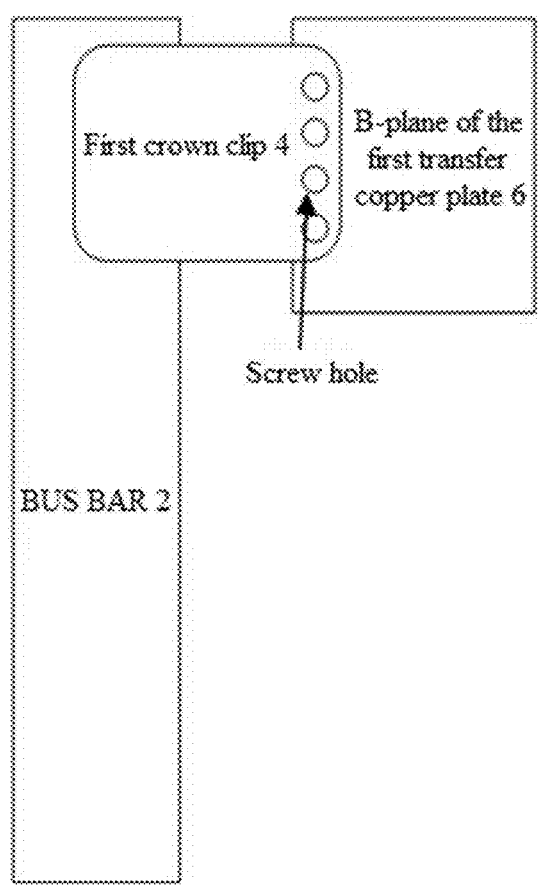
FIG. 4 is a schematic connection diagram of a B-plane of the transfer copper plate, the crown clip and the BUS BAR shown in FIG. 2.

As shown in FIG. 2 and FIG. 3, the first transfer copper plate is L-shaped, and the L-shaped transfer copper plate includes an A-plane and a B-plane. An angle is formed between the A-plane and the B-plane to form the L shape. One plane of the first crown clip 4 and the B-plane of the first transfer copper plate 6 are secured with a screw. The other plane of the first crown clip 4 is inserted into the BUS BAR 2. The A-plane of the first transfer copper plate 6 and the first power supply copper plate 8 are secured with a screw. E-plane of the first power supply copper plate 8 is parallel to the C-plane of the rack. The C-plane of the rack, the E-plane of the first power supply copper plate 8, and the B-plane of the first transfer copper plate 6 and the BUS BAR 2 are parallel to each other. As shown in FIG. 4, the B-plane of the first transfer copper plate 6, the first crown clip 4 and the BUS BAR 2 are arranged on the same plane.

The second transfer copper plate, the second crown clip and the second power supply copper plate are connected in the same manner as the first transfer copper plate, the first crown clip and the first power supply copper plate.

The terms such as "first", "second", "third" (if exists) in the specification and the claims of the present disclosure are used to distinguish similar objects, rather than describing a specific order or a sequence. It should be understood that data described through the terms is exchangeable when appropriate, so that the described embodiments of the present disclosure can be implemented in a sequence other than the sequence illustrated or described herein. Moreover, the terms "comprise", "include", and any variations thereof are intended to cover non-exclusive inclusion.

The foregoing is only preferred embodiments of the present disclosure, but the present disclosure is not limited thereto. Any change thought by those skilled in the art without creative work, and multiple improvements and modifications made by those skilled in the art without departing from the principle of the present disclosure, should all fall within the protection scope of the present disclosure.

The invention claimed is:

1. A power supply system for reducing voltage fluctuation of a rack GPU, comprising
a PSU power supply module;
two power supply copper plates comprising a first power supply copper plate and a second power supply copper plate;
two transfer copper plates comprising a first transfer copper plate and a second transfer copper plate; and
two crown clips comprising a first crown clip and a second crown clip,
wherein the PSU power supply module is connected to the first power supply copper plate, the first power supply copper plate is connected to the first crown clip through the first transfer copper plate, the first crown clip is connected to a BUS BAR, the BUS BAR is connected to the second power supply copper plate through the second crown clip and the second transfer copper plate sequentially, and the second power supply copper plate is connected to a GPU module mainboard.

2. The power supply system for reducing the voltage fluctuation of the rack GPU according to claim 1,
wherein each of the two power supply copper plates comprises a source power supply copper plate and a ground power supply copper plate, and
for each of the two power supply copper plates, the source power supply copper plate and the ground power supply copper plate are arranged to be parallel to each other, and the ground power supply copper plate is arranged above the source power supply copper plate;
wherein each of the two transfer copper plates comprises a ground transfer copper plate and a source transfer copper plate, and
for each of the two transfer copper plates, the ground transfer copper plate and the source transfer copper plate are arranged to be parallel to each other, and the ground transfer copper plate is arranged above the source transfer copper plate; and
wherein each of the two crown clips comprises a ground crown clip and a source crown clip, and
for each of the two crown clips, the ground crown clip and the source crown clip are arranged to be parallel to each other, a width of the first crown clip is not greater than a width of the first transfer copper plate, and a width of the second crown clip is not greater than a width of the second transfer copper plate.

3. The power supply system for reducing the voltage fluctuation of the rack GPU according to claim 2, wherein the BUS BAR comprises two parallel copper plates comprising a source copper plate and a ground copper plate.

4. The power supply system for reducing the voltage fluctuation of the rack GPU according to claim 3, wherein
a Switch chip and a plurality of GPU connectors are arranged on the GPU module mainboard, and each of the plurality of GPU connectors is connected to a GPU, and GPU source screw holes, GPU ground screw holes, a GPU mainboard source screw hole, and a GPU mainboard ground screw hole are arranged on the GPU module mainboard.

5. The power supply system for reducing the voltage fluctuation of the rack GPU according to claim 4, wherein
GPU power supply screw holes are arranged on the source power supply copper plate of the second power supply copper plate, and ground screw holes are arranged on the ground power supply copper plate of the second power supply copper plate, and
a circular area filled with bare copper is arranged at the peripheral of each of the power supply screw holes and the peripheral of each of the ground screw holes.

6. The power supply system for reducing the voltage fluctuation of the rack GPU according to claim 5, wherein the second power supply copper plate is arranged right below the GPU module mainboard,
the second power supply copper plate is connected to the GPU module mainboard with a screw, and supplies power to the GPU module mainboard, and
the second power supply copper plate is connected to each of the GPUs with a screw, and supplies power to the GPUs.

7. The power supply system for reducing the voltage fluctuation of the rack GPU according to claim 6, wherein a through hole through which a source screw passes is arranged on the ground power supply copper plate of the second power supply copper plate, and a diameter of the through hole is greater than a diameter of the source screw.

8. The power supply system for reducing the voltage fluctuation of the rack GPU according to claim 2, wherein an area of the source power supply copper plate of the second power supply copper plate is not less than an area of the GPU module mainboard.

9. The power supply system for reducing the voltage fluctuation of the rack GPU according to claim 1, wherein each of the two transfer copper plates is L-shaped.

10. The power supply system for reducing the voltage fluctuation of the rack GPU according to claim 1, wherein
the first crown clip and the first transfer copper plate are secured with a screw, the first transfer copper plate and the first power supply copper plate are secured with a screw, and
the second crown clip and the second transfer copper plate are secured with a screw, and the second transfer copper plate and the second power supply copper plate are secured with a screw.

* * * * *